(12) United States Patent
Jhong et al.

(10) Patent No.: US 8,262,301 B2
(45) Date of Patent: Sep. 11, 2012

(54) DEVELOPER SPRAYING DEVICE FOR REDUCING USAGE QUANTITY OF DEVELOPER

(75) Inventors: Jhin-Siang Jhong, Hualien County (TW); Sheng Cheng, Taipei County (TW)

(73) Assignee: Inotera Memories, Inc., Taoyuan County (TW)

( * ) Notice: Subject to any disclaimer, the term of this patent is extended or adjusted under 35 U.S.C. 154(b) by 138 days.

(21) Appl. No.: 12/963,905

(22) Filed: Dec. 9, 2010

(65) Prior Publication Data
US 2012/0033191 A1 Feb. 9, 2012

(30) Foreign Application Priority Data
Aug. 6, 2010 (TW) ................................ 99126329 A

(51) Int. Cl.
*G03D 5/00* (2006.01)
(52) U.S. Cl. ..... 396/611; 355/27; 427/427.2; 427/427.3
(58) Field of Classification Search .................. 396/611
See application file for complete search history.

(56) References Cited

U.S. PATENT DOCUMENTS

| | | | | |
|---|---|---|---|---|
| 5,571,560 | A * | 11/1996 | Lin | 427/240 |
| 6,165,552 | A * | 12/2000 | Anai et al. | 427/240 |
| 6,364,547 | B1 * | 4/2002 | Matsuyama et al. | 396/611 |
| 6,382,849 | B1 * | 5/2002 | Sakamoto et al. | 396/611 |
| 6,527,861 | B2 * | 3/2003 | Takekuma | 118/54 |
| 7,550,043 | B2 * | 6/2009 | Shiraishi et al. | 118/52 |
| 2001/0016121 | A1 * | 8/2001 | Sakamoto et al. | 396/611 |
| 2004/0173948 | A1 * | 9/2004 | Pandelisev | 264/500 |
| 2007/0089671 | A1 * | 4/2007 | Gurer et al. | 118/313 |
| 2010/0098869 | A1 * | 4/2010 | Kinoshita | 427/421.1 |
| 2012/0033191 | A1 * | 2/2012 | Jhong et al. | 355/27 |

* cited by examiner

*Primary Examiner* — Clayton E Laballe
*Assistant Examiner* — Bret Adams
(74) *Attorney, Agent, or Firm* — Rosenberg, Klein & Lee

(57) ABSTRACT

A developer spraying device for reducing usage quantity of developer includes a hollow inner tube unit and a hollow outer tube unit. The hollow inner tube unit includes a hollow inner tube and a plurality of nozzles communicating an inner portion of the hollow inner tube with external world. The hollow inner tube has at least one liquid receiving space formed therein, and the liquid receiving space is filled with the developer. The hollow outer tube unit includes a hollow outer tube disposed around the hollow inner tube and tightly mated with the hollow inner tube and an opening formed on the hollow outer tube and communicating with an inner portion of the hollow outer tube. The hollow outer tube is selectively rotated clockwise or anticlockwise relative to the hollow inner tube, thus the nozzles are selectively exposed from the opening or shaded by the hollow outer tube.

8 Claims, 8 Drawing Sheets

DEVELOPER SPRAYING DEVICE FOR REDUCING USAGE QUANTITY OF DEVELOPER

BACKGROUND OF THE INVENTION

1. Field of the Invention

The instant disclosure relates to a developer spraying device, and more particularly, to a developer spraying device for reducing usage quantity of developer.

2. Description of Related Art

The photolithography technology playing a key role in forming sophisticated circuit patterns on modern semiconductor wafers. In general, a photoresist film is deposited onto a substrate wafer during photolithography process and thereafter pattern-exposed to lithographic equipments in order to transcribe a selected circuit pattern thereon. The photoresist is subsequently processed with a developer solution to obtain a resist pattern corresponding to the transcribed pattern. The developer is used to chemically react with the photo-resist and remove the relatively more soluble areas thereof, thus leaving behind the remaining image pattern which then serves as a photo-mask for etching multiple semiconductor wafer layers.

In order to form desired patterns on a substrate, the photo-resist is processed during the development step with a solution that is applied in a highly controlled manner. The application of photo-resist or resist development is carried out while a semiconductor wafer is rotated at various speeds and stopped intermittently at preselected time intervals to ensure the deposition of a photo-resist layer of substantially uniformed thickness. For example, the wafer may be rotated while a developing solution is dispensed onto the wafer from the discharge port of a spraying nozzle. A thin film of developing solution may then be formed with a relatively uniform thickness across the surface of the wafer. Both the wafer and the developer film formed thereon are held stationary thereafter for a predetermined time interval so that developing solution remains in intimate contact with the resist-coated wafer in order to develop a light-exposed latent image thereon. Upon completion of this step in the development process, pure water or other rinsing solutions can be supplied from a washing liquid supplying nozzle onto the surface of the wafer. The pure water or rinsing solution may eventually be scattered off by rotating the wafer at a relatively high speed to spin dry the surface of the wafer to complete this stage of wafer processing.

There are several common methods for developing a photoresist patterned image. For example, multiple wafers may be batched-immersed and agitated in a developer bath during a process known as immersion developing. This development process has certain advantages including high throughput capabilities. However the exposure time of the resist to the developer is relatively long and the overall process typically lack the sophistication and precision in higher level of critical dimension control required by processing more densely populated semiconductor wafers. Alternatively, in spray development, the developer can be sprayed onto a resist while the wafer is spun at a relatively high speed. Each wafer is individually treated with its own dose of developer solution. While spray development is generally an effective method to dissolve resist, it is often difficult to control the precise and uniform application of the developer to the wafer through the spray nozzle. During application of the developer, a portion of the solution may be sprayed outside of the wafer surface and wasted. Uneven exposure to developer may also adversely affect critical dimension control.

Referring to FIG. 1A, which shows a perspective, schematic view of a developer spraying device used to spray developer. When the developer spraying device A passes through (shown as the direction of the arrow in FIG. 1A) the top of wafer W, the developer D which the developer spraying device A carries can be sprayed on the surface of wafer W.

However, please refer to FIG. 1B, which shows a schematic view of developer coated on and outside the top surface of a wafer. Because the nozzles at the bottom of the developer spraying device A lines up straight, and the top surface of the wafer W is circular, when the developer spraying device A passes through the top of the wafer W, the developer D which the developer spraying device A carries will be sprayed on not only the top surface of the wafer W, but also the developer D' will be sprayed on the outer surrounding region outside the top surface of the wafer W. Therefore, when the developer D' is sprayed at the outer surrounding region outside the wafer W, the outer surrounding region becomes a redundant developer spraying region, which wastes developer and does not meet the requirement of modern environmental protection.

SUMMARY OF THE INVENTION

One particular aspect of the instant disclosure is to provide a developer spraying device for reducing usage quantity of developer, thus the instant disclosure can decrease manufacturing cost and protect environment.

To achieve the above-mentioned advantages, one embodiment of the instant disclosure provides a developer spraying device for reducing usage quantity of developer, including: a hollow inner tube unit and a hollow outer tube unit. The hollow inner tube unit includes a hollow inner tube and a plurality of nozzles arranged to form a predetermined shape and communicating an inner portion of the hollow inner tube with external world, where the hollow inner tube has at least one liquid receiving space formed therein, and the liquid receiving space is filled with the developer. The hollow outer tube unit includes a hollow outer tube disposed around the hollow inner tube and tightly mated with the hollow inner tube and an opening formed on the hollow outer tube and communicating with an inner portion of the hollow outer tube. The hollow outer tube is selectively rotated clockwise or anticlockwise relative to the hollow inner tube, thus the nozzles are selectively exposed from the opening or shaded by the hollow outer tube.

To achieve the above-mentioned advantages, one embodiment of the instant disclosure provides a developer spraying device for reducing usage quantity of developer, including: a hollow inner tube unit and a hollow outer tube unit. The hollow inner tube unit includes a hollow inner tube and an opening formed on the hollow inner tube and communicating with an inner portion of the hollow inner tube. The hollow outer tube unit includes a hollow outer tube disposed around the hollow inner tube and tightly mated with the hollow inner tube and a plurality of nozzles arranged to form a predetermined shape and communicating an inner portion of the hollow outer tube with external world. The hollow outer tube has at least one liquid receiving space formed therein, and the liquid receiving space is filled with the developer. The hollow inner tube is selectively rotated clockwise or anticlockwise relative to the hollow outer tube, thus the nozzles are selectively exposed from the opening or shaded by the hollow inner tube.

Therefore, when the nozzles pass through a wafer slowly, the developer can be formed on the top surface of the wafer only and do not formed outside the top surface of the wafer, thus the usage quantity of the developer can be reduced effectively for decreasing manufacturing cost and protecting environment.

To further understand the techniques, means and effects the instant disclosure takes for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention that they be used for limiting the instant disclosure.

DETAILED DESCRIPTION OF THE PREFERRED EMBODIMENTS

Figure 1A:
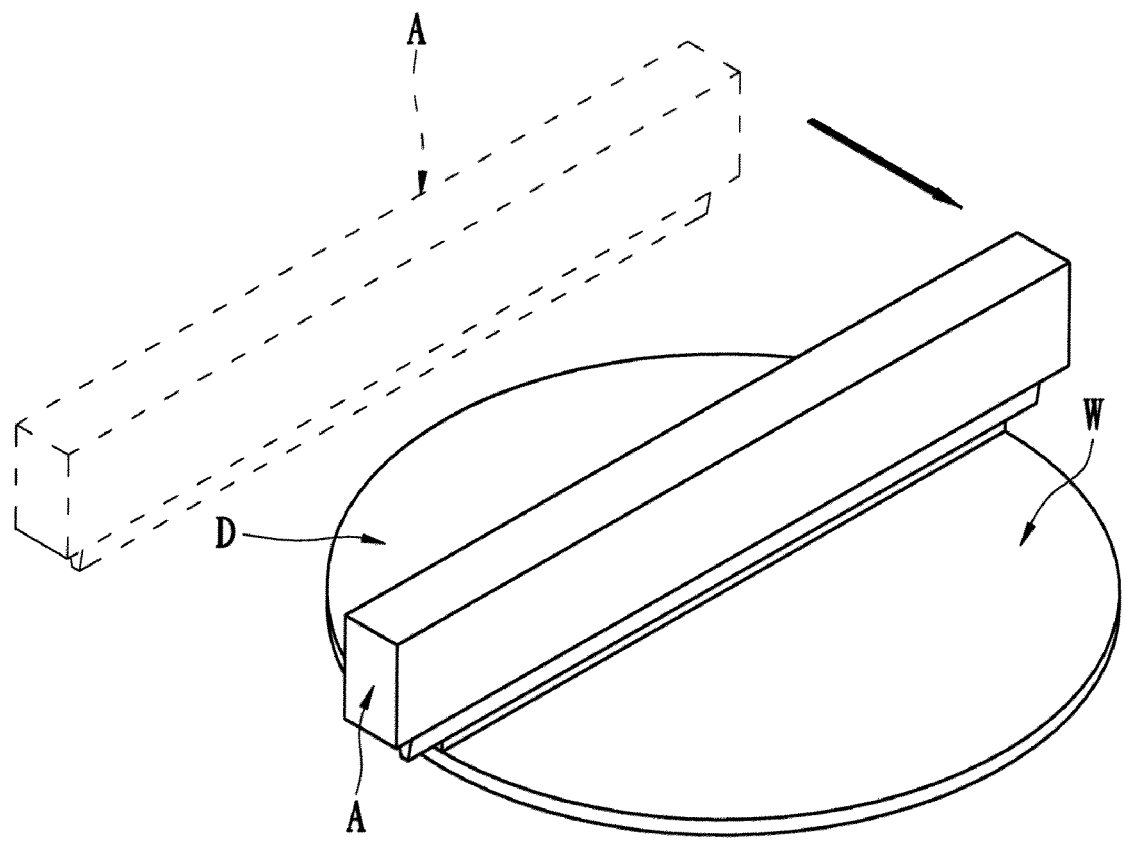
FIG. 1A shows a perspective, schematic view of a developer spraying device used to spray developer according to the related art.
Figure 1B:
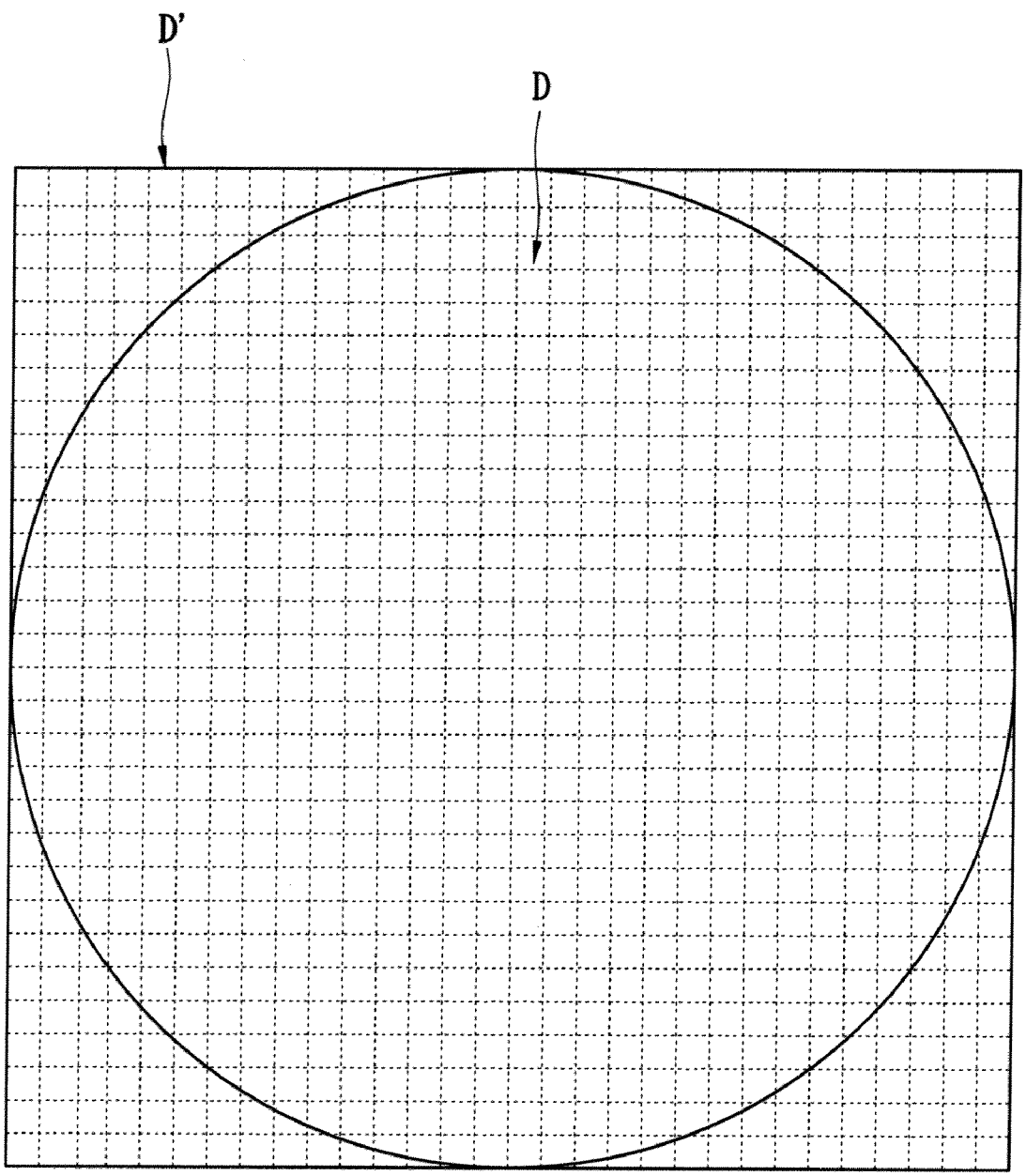
FIG. 1B shows a schematic view of developer coated on and outside the top surface of a wafer according to the related art.
Figure 2A:
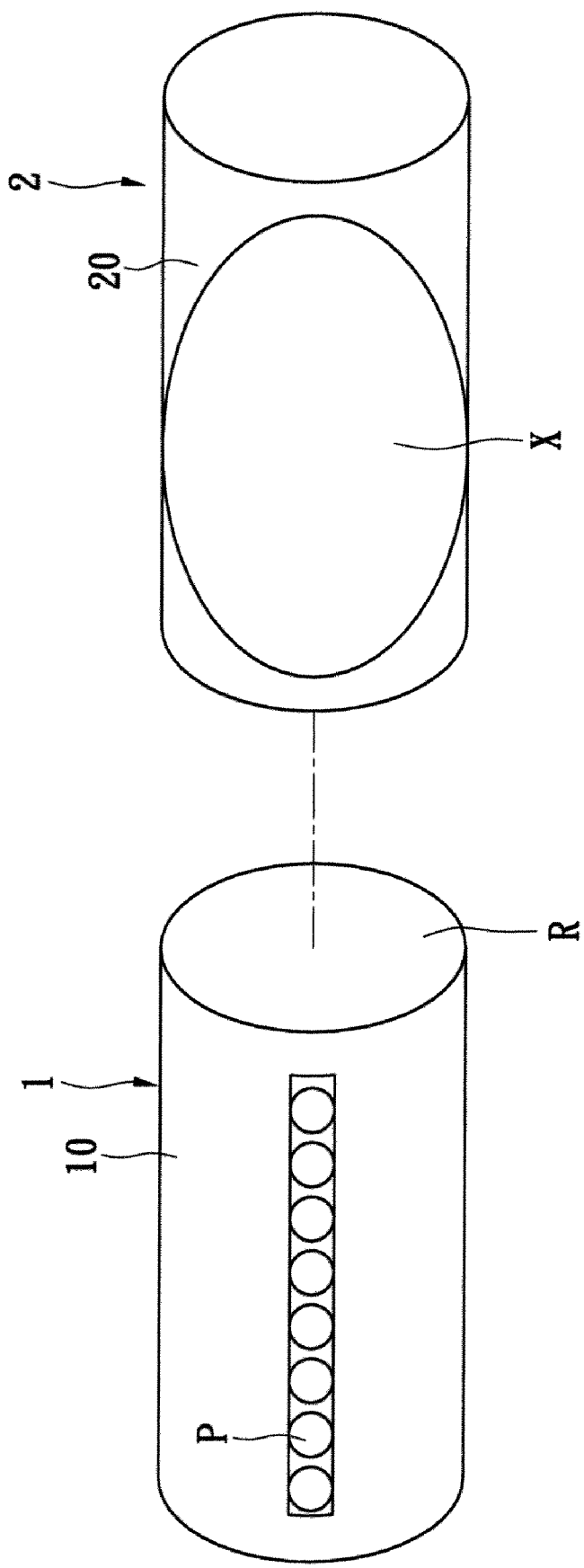
FIG. 2A shows an exploded, schematic view of a developer spraying device according to the first embodiment of the instant disclosure.
Figure 2B:
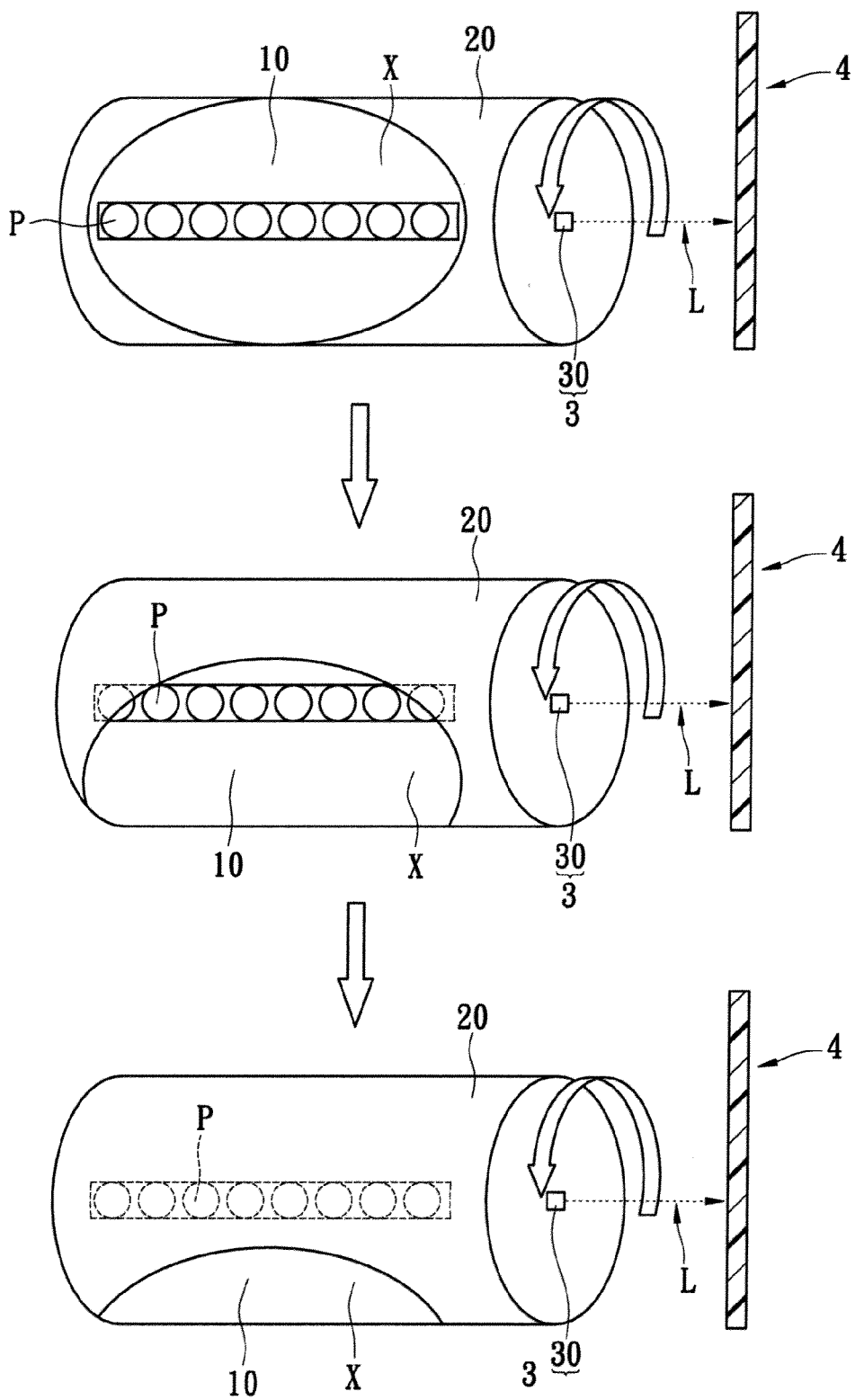
FIG. 2B is a schematic view showing three different usage states according to the first embodiment of the instant disclosure.
Figure 2C:
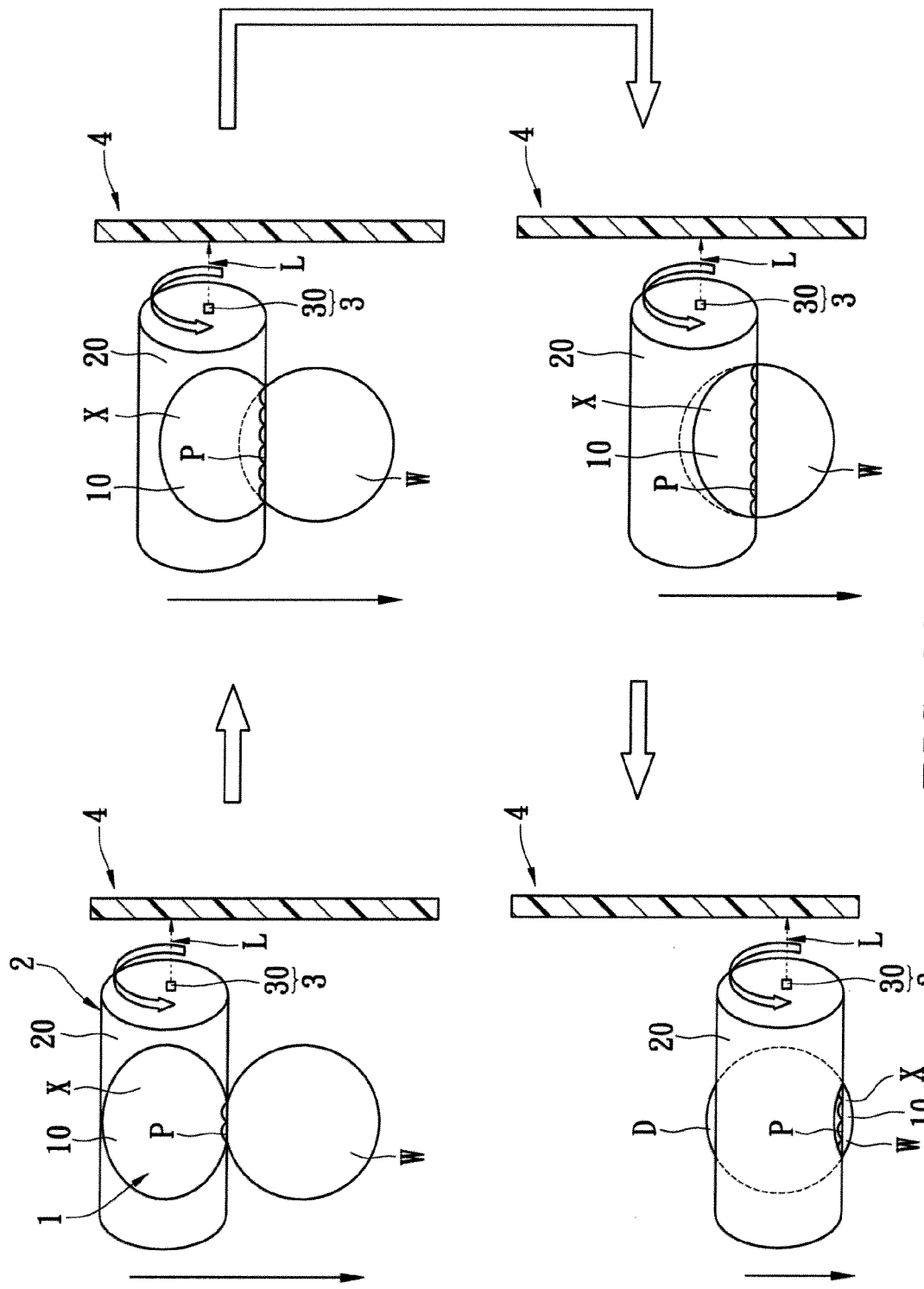
FIG. 2C is a schematic view showing four different usage states for spraying the developer on the top surface of a wafer according to the first embodiment of the instant disclosure.

Referring to FIGS. 2A, 2B and 2C, where the first embodiment of the instant disclosure provides a developer spraying device for reducing usage quantity of developer, including: a hollow inner tube unit 1 and a hollow outer tube unit 2.

The hollow inner tube unit 1 includes a hollow inner tube 10 and a plurality of nozzles P arranged to form a predetermined shape and communicating an inner portion of the hollow inner tube 10 with external world. The hollow inner tube 10 has at least one liquid receiving space R formed therein, and the liquid receiving space R is filled with the developer D (shown in FIG. 2C, but FIGS. 2A and 2B). For example, the nozzles P can be arranged to form a line shape, and the nozzles P can be disposed on the hollow inner tube 10 or combined with the hollow inner tube 10 (because the hollow inner tube 10 is shown as a hollow annular casing with a predetermined thickness, each nozzle P can pass through the hollow annular casing for communicating the hollow inner tube 10 with the external world). In other words, when the liquid receiving space R is filled with the developer D, the developer D can be straightly sprayed out through the nozzles P due to the line-shaped nozzles P.

The hollow outer tube unit 2 includes a hollow outer tube 20 disposed around the hollow inner tube 10 and tightly mated with the hollow inner tube 10 and an opening formed on the hollow outer tube X and communicating with an inner portion of the hollow outer tube 20. The hollow outer tube 20 is shown as a hollow annular casing with a predetermined thickness, and the opening X may be a circular shape, a semi-circular shape, an elliptical shape, a semi-elliptical shape, a diamond shape, or a triangular shape, etc.

Therefore, when the hollow outer tube 20 is disposed around the hollow inner tube 10 and tightly mated with the hollow inner tube 10, the hollow outer tube 20 can be selectively rotated clockwise or anticlockwise relative to the hollow inner tube 10, thus the outlets of the nozzles P can be selectively exposed from the opening X or shaded by the hollow outer tube 20. In other words, when the hollow inner tube 10 is fixed, the hollow outer tube 20 can be selectively rotated clockwise or anticlockwise relative to the hollow inner tube 10, thus the outlets of the nozzles P can selectively close to or far away from the opening X. Because the outlets of the nozzles P can selectively close to or far away from the opening X, the developer D can be selectively sprayed out from all or one part of the nozzles P. Thus, as the hollow outer tube rotates with respect to the hollow inner tube, the opening of the outer unit correspondingly regulates the liquid flow through the nozzles of the inner unit.

For example, when the hollow outer tube 20 is rotated anticlockwise relative to the hollow inner tube 10 (as shown in FIG. 2B), the outlets of the nozzles P can be selectively opened fully (shown as the topmost figure in FIG. 2B), opened or shaded partially (shown as the middle figure in FIG. 2B), or shaded fully (shown as the bottommost figure in FIG. 2B).

For example, the hollow outer tube 20 can be rotated anticlockwise relative to the hollow inner tube 10 (as shown in FIG. 2B), thus when the nozzles P pass through a wafer W slowly, the developer D sprayed out from the nozzles P can only be formed on the top surface of the wafer W and do not formed outside the top surface of the wafer W. Therefore, the developer D can be formed on the top surface of the wafer W only, thus the usage quantity of the developer D can be reduced effectively for decreasing manufacturing cost and protecting environment.

Furthermore, the developer spraying device further includes a light-projecting unit 3. The light-projecting unit 3 includes at least one light-projecting element 30 disposed on an outer surface of the hollow outer tube 20 for generating at least one indication light beam L (as shown in FIGS. 2B and 2C). In addition, the developer spraying device further includes an optical ruler 4 disposed beside the light-projecting element 30, and the indication light beam L can be projected onto the optical ruler 4. For example, the light-projecting element 30 may be an LED or any lighting device, and the light-projecting element 30 can be positioned on the axle center of the hollow outer tube 20. The light-projecting unit 3, together with the optical ruler 4, can provide the detection and measurement capabilities necessary for calculating the desired rotational speed between the inner and the outer units, thus achieving effective nozzle control for the dispensing of liquid developer. When the hollow inner tube 10 and the hollow outer tube 20 are straightly moved (shown as the four downward arrows in FIG. 2C) over the wafer W, the indication light beam L generated by the light-projecting element 30 can not only be projected onto the optical ruler 4, but also be moved straightly along the optical ruler 4. In other words, when the indication light beam L is projected onto the optical ruler 4, the user can use the optical ruler 4 to figure out the move velocity of the nozzles P (the positions of the nozzles P) and the rotation rate of the hollow outer tube 20. Therefore, both the move velocity of the nozzles P and the rotation rate of the hollow outer tube 20 can be adjusted to ensure that the developer D sprayed out from the nozzles P can only be formed on the top surface of the wafer W and do not formed outside the top surface of the wafer W.

Figure 3A:
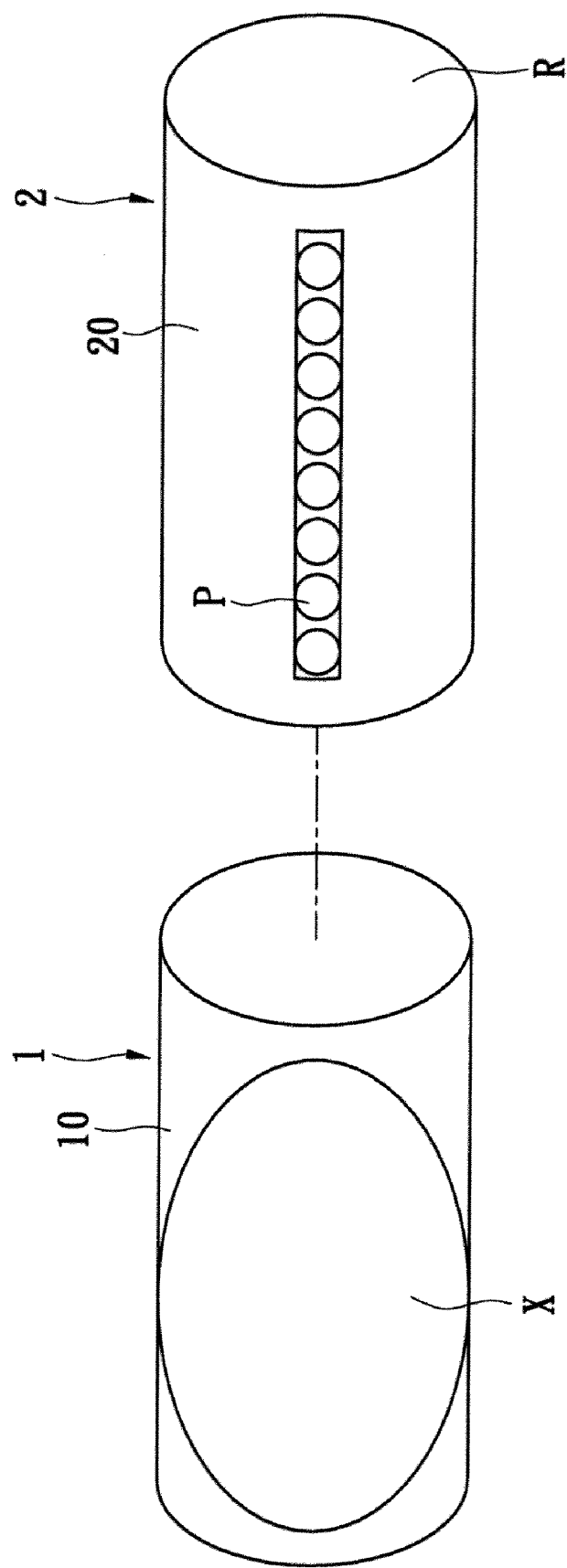
FIG. 3A shows an exploded, schematic view of a developer spraying device according to the second embodiment of the instant disclosure.
Figure 3B:
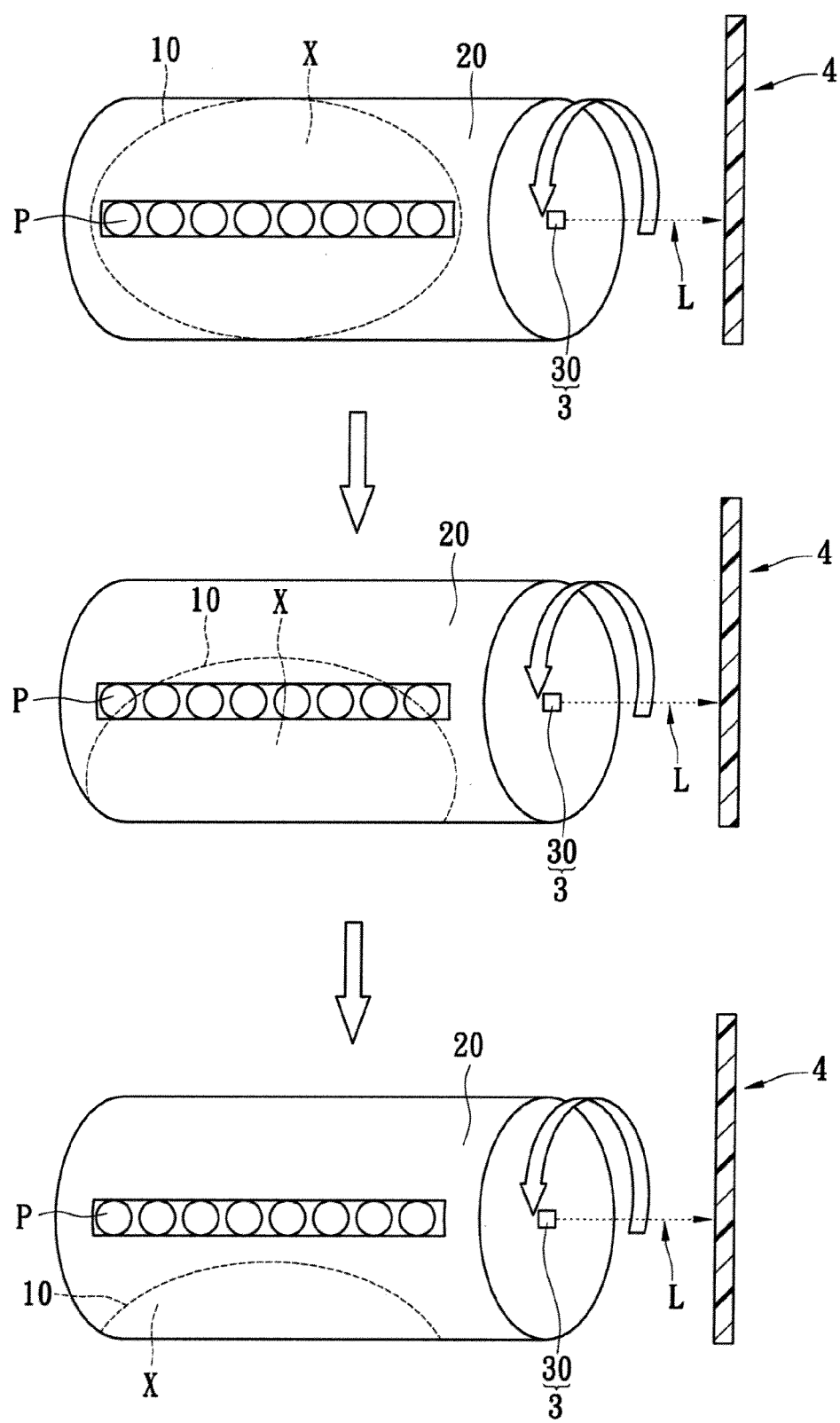
FIG. 3B is a schematic view showing three different usage states according to the second embodiment of the instant disclosure.
Figure 3C:
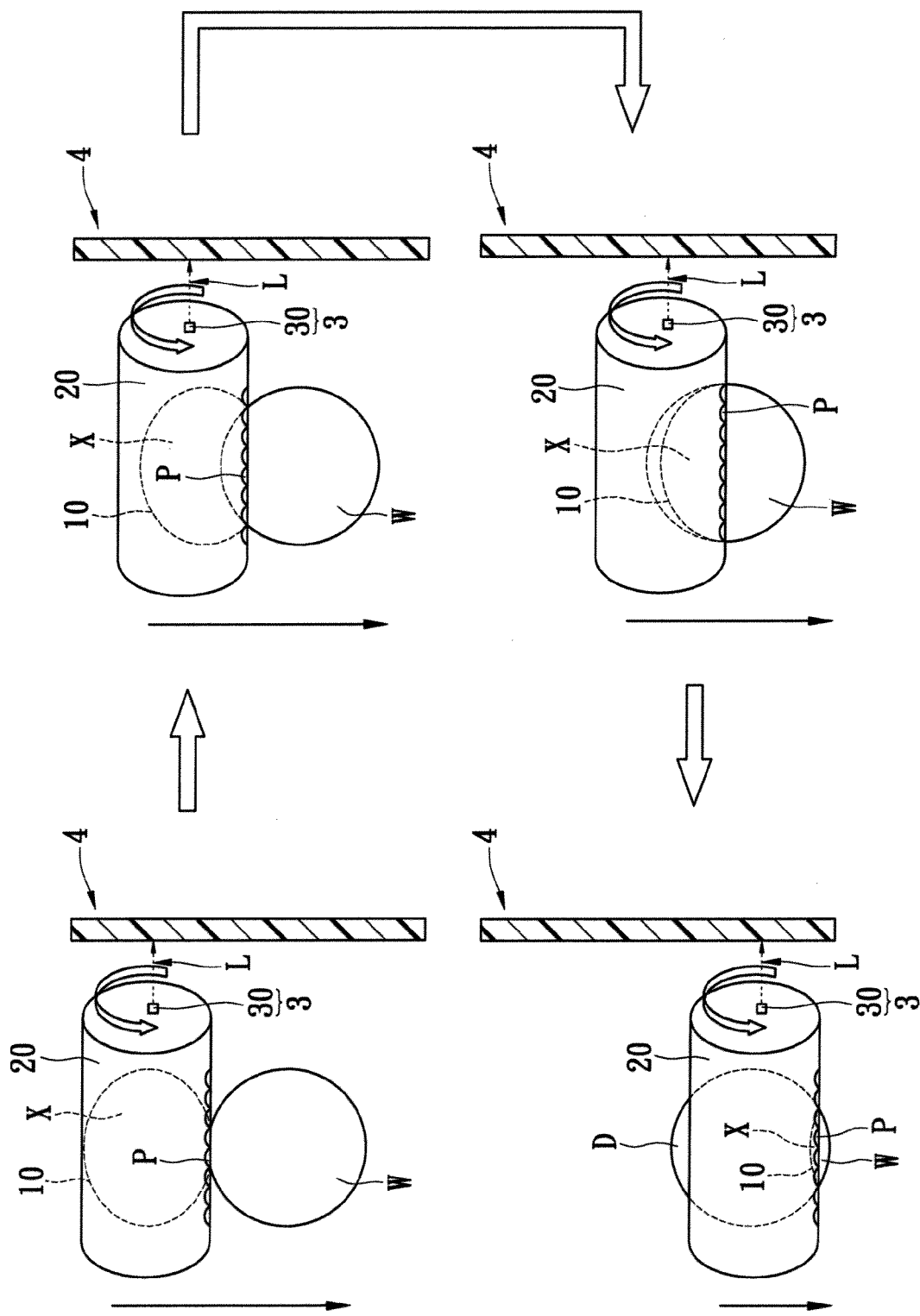
FIG. 3C is a schematic view showing four different usage states for spraying the developer on the top surface of a wafer according to the second embodiment of the instant disclosure.

Referring to FIGS. 3A, 3B and 3C, where the second embodiment of the instant disclosure provides a developer spraying device for reducing usage quantity of developer, including: a hollow inner tube unit 1 and a hollow outer tube unit 2.

The hollow inner tube unit 1 includes a hollow inner tube 10 and an opening X formed on the hollow inner tube 10 and communicating with an inner portion of the hollow inner tube 10. The hollow inner tube 10 is shown as a hollow annular casing with a predetermined thickness, and the opening X may be a circular shape, a semi-circular shape, an elliptical shape, a semi-elliptical shape, a diamond shape, or a triangular shape, etc.

The hollow outer tube unit 2 includes a hollow outer tube 20 disposed around the hollow inner tube 10 and tightly mated with the hollow inner tube 10 and a plurality of nozzles P arranged to form a predetermined shape and communicating an inner portion of the hollow outer tube 20 with external world. The hollow outer tube 20 has at least one liquid receiving space R formed therein, and the liquid receiving space R is filled with the developer D (shown in FIG. 3C, but FIGS. 3A and 3B). For example, the nozzles P can be arranged to form a line shape, and the nozzles P can be disposed on the hollow outer tube 20 or combined with the hollow outer tube 20 (because the hollow outer tube 20 is shown as a hollow annular casing with a predetermined thickness, each nozzle P can pass through the hollow annular casing for communicating the hollow outer tube 20 with the external world). In other words, when the liquid receiving space R is filled with the developer D, the developer D can be straightly sprayed out through the nozzles P due to the line-shaped nozzles P.

Therefore, when the hollow outer tube 20 is disposed around the hollow inner tube 10 and tightly mated with the hollow inner tube 10, the hollow inner tube 10 can be selectively rotated clockwise or anticlockwise relative to the hollow outer tube 20, thus the inlets of the nozzles P can be selectively exposed from the opening X or shaded by the hollow inner tube 10. In other words, when the hollow outer tube 20 is fixed, the hollow inner tube 10 can be selectively rotated clockwise or anticlockwise relative to the hollow outer tube 20, thus the inlets of the nozzles P can selectively close to or far away from the opening X. Because the inlets of the nozzles P can selectively close to or far away from the opening X, the developer D can be selectively sprayed out from all or one part of the nozzles P. Thus, as the hollow outer tube rotates with respect to the hollow inner tube, the opening of the outer unit correspondingly regulates the liquid flow through the nozzles of the inner unit.

For example, when the hollow inner tube 10 is rotated anticlockwise relative to the hollow outer tube 20 (as shown in FIG. 3B), the inlets of the nozzles P can be selectively opened fully (shown as the topmost figure in FIG. 3B), opened or shaded partially (shown as the middle figure in FIG. 3B), or shaded fully (shown as the bottommost figure in FIG. 3B).

For example, the hollow inner tube 10 can be rotated anticlockwise relative to the hollow outer tube 20 (as shown in FIG. 3C), thus when the nozzles P pass through a wafer W slowly, the developer D sprayed out from the nozzles P can only be formed on the top surface of the wafer W and do not formed outside the top surface of the wafer W. Therefore, the developer D can be formed on the top surface of the wafer W only, thus the usage quantity of the developer D can be reduced effectively for decreasing manufacturing cost and protecting environment.

Furthermore, the developer spraying device further includes a light-projecting unit 3. The light-projecting unit 3 includes at least one light-projecting element 30 disposed on an outer surface of the hollow inner tube 10 for generating at least one indication light beam L (as shown in FIGS. 3B and 3C). In addition, the developer spraying device further includes an optical ruler 4 disposed beside the light-projecting element 30, and the indication light beam L can be projected onto the optical ruler 4. For example, the light-projecting element 30 may be an LED or any lighting device, and the light-projecting element 30 can be positioned on the axle center of the hollow inner tube 10. Hence, when the hollow inner tube 10 and the hollow outer tube 20 are straightly moved (shown as the four downward arrows in FIG. 3C) over the wafer W, the indication light beam L generated by the light-projecting element 30 can not only be projected onto the optical ruler 4, but also be moved straightly along the optical ruler 4. In other words, when the indication light beam L is projected onto the optical ruler 4, the user can use the optical ruler 4 to figure out the move velocity of the nozzles P (the positions of the nozzles P) and the rotation rate of the hollow inner tube 10. Therefore, both the move velocity of the nozzles P and the rotation rate of the hollow inner tube 10 can be adjusted to ensure that the developer D sprayed out from the nozzles P can only be formed on the top surface of the wafer W and do not formed outside the top surface of the wafer W.

In conclusion, when the nozzles pass through a wafer slowly, the developer can be formed on the top surface of the wafer only and do not formed outside the top surface of the wafer, thus the usage quantity of the developer can be reduced effectively for decreasing manufacturing cost and protecting environment.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A developer spraying device, comprising:
   a hollow inner tube unit including a hollow inner tube and a plurality of nozzles arranged to form a predetermined shape and communicating an inner portion of the hollow inner tube with external world, wherein the hollow inner tube has at least one liquid receiving space formed therein, and the liquid receiving space is filled with the developer; and
   a hollow outer tube unit including a hollow outer tube disposed around the hollow inner tube and tightly mated with the hollow inner tube and an opening formed on the hollow outer tube and communicating with an inner portion of the hollow outer tube, wherein the hollow outer tube is selectively rotated clockwise or anticlockwise relative to the hollow inner tube, thus the nozzles are selectively exposed from the opening or shaded by the hollow outer tube.

2. The developer spraying device of claim 1, wherein the nozzles are arranged to form a line shape, and the opening is a circular shape, a semi-circular shape, an elliptical shape, a semi-elliptical shape, a diamond shape, or a triangular shape, wherein the nozzles are selectively close to or far away from the opening, thus the developer is selectively sprayed out from all or one part of the nozzles.

3. The developer spraying device of claim 1, further comprising: a light-projecting unit including at least one light-projecting element disposed on an outer surface of the hollow outer tube for generating at least one indication light beam.

4. The developer spraying device of claim 3, further comprising: an optical ruler disposed beside the light-projecting element, wherein the indication light beam is projected onto the optical ruler.

5. A developer spraying device, comprising:
   a hollow inner tube unit including a hollow inner tube and an opening formed on the hollow inner tube and communicating with an inner portion of the hollow inner tube; and
   a hollow outer tube unit including a hollow outer tube disposed around the hollow inner tube and tightly mated with the hollow inner tube and a plurality of nozzles arranged to form a predetermined shape and communicating an inner portion of the hollow outer tube with external world;
   wherein the hollow outer tube has at least one liquid receiving space formed therein, and the liquid receiving space is filled with the developer;
   wherein the hollow inner tube is selectively rotated clockwise or anticlockwise relative to the hollow outer tube, thus the nozzles are selectively exposed from the opening or shaded by the hollow inner tube.

6. The developer spraying device of claim 5, wherein the nozzles are arranged to form a line shape, and the opening is a circular shape, a semi-circular shape, an elliptical shape, a semi-elliptical shape, a diamond shape, or a triangular shape, wherein the nozzles are selectively close to or far away from the opening, thus the developer is selectively sprayed out from all or one part of the nozzles.

7. The developer spraying device of claim 5, further comprising: a light-projecting unit including at least one light-projecting element disposed on an outer surface of the hollow inner tube for generating at least one indication light beam.

8. The developer spraying device of claim 7, further comprising: an optical ruler disposed beside the light-projecting element, wherein the indication light beam is projected onto the optical ruler.

* * * * *